(12) United States Patent
Chen et al.

(10) Patent No.: US 8,076,962 B2
(45) Date of Patent: Dec. 13, 2011

(54) FREQUENCY SYNTHESIS SYSTEM WITH SELF-CALIBRATED LOOP STABILITY AND BANDWIDTH

(75) Inventors: Chun-Liang Chen, Yongkang (TW); Hui-Chun Hsu, Bade (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/923,200

(22) Filed: Sep. 9, 2010

(65) Prior Publication Data

US 2011/0063004 A1    Mar. 17, 2011

(30) Foreign Application Priority Data

Sep. 14, 2009   (TW) .............................. 98130877 A

(51) Int. Cl.
*H03L 7/06* (2006.01)
(52) U.S. Cl. ........................................ 327/157; 327/148
(58) Field of Classification Search .................. 327/148, 327/157
See application file for complete search history.

(56) References Cited

U.S. PATENT DOCUMENTS

| | | | | |
|---|---|---|---|---|
| 6,819,190 B2 * | 11/2004 | Pearce et al. | .................... | 331/57 |
| 6,842,399 B2 * | 1/2005 | Harrison | .................. | 365/189.07 |
| 6,870,415 B2 * | 3/2005 | Zhang et al. | .................. | 327/274 |
| 7,336,752 B2 * | 2/2008 | Vlasenko et al. | ............. | 375/376 |
| 7,342,426 B2 * | 3/2008 | Kurd et al. | ..................... | 327/156 |
| 7,355,486 B2 * | 4/2008 | Kelkar et al. | .................... | 331/16 |
| 7,372,339 B2 * | 5/2008 | Fu | .................................... | 331/16 |
| 7,791,384 B2 * | 9/2010 | Lee et al. | ......................... | 327/158 |
| 7,915,963 B2 * | 3/2011 | Kelkar et al. | .................... | 331/57 |
| 2002/0175722 A1 * | 11/2002 | Mano et al. | .................... | 327/156 |
| 2005/0134336 A1 * | 6/2005 | Goldblatt et al. | ............. | 327/156 |
| 2006/0066368 A1 * | 3/2006 | Gabato et al. | ................. | 327/158 |
| 2007/0046343 A1 * | 3/2007 | Kurd et al. | ..................... | 327/156 |
| 2007/0164797 A1 * | 7/2007 | Law et al. | ...................... | 327/149 |
| 2008/0061895 A1 * | 3/2008 | Kelkar et al. | .................... | 331/57 |
| 2008/0191759 A1 * | 8/2008 | Neurauter et al. | ............ | 327/157 |
| 2009/0322391 A1 * | 12/2009 | Lee et al. | ...................... | 327/158 |
| 2010/0141311 A1 * | 6/2010 | Kim et al. | ...................... | 327/157 |
| 2010/0156488 A1 * | 6/2010 | Kim et al. | ...................... | 327/158 |
| 2010/0321077 A1 * | 12/2010 | Lee et al. | ....................... | 327/158 |

* cited by examiner

*Primary Examiner* — Lincoln Donovan
*Assistant Examiner* — Adam Houston
(74) *Attorney, Agent, or Firm* — Bacon & Thomas, PLLC

(57) ABSTRACT

In a frequency synthesis system with self-calibrated loop stability and bandwidth, a detector produces a detection signal based on a difference between an input signal and a feedback signal; a charge pump produces a control signal based on the detection signal; a filter produces a tuning signal and a source current based on the control signal; a bias circuit produces first and second bias signals; a controllable oscillator produces a differential output signal with a selected specific frequency; a differential-to-single converter produces an output signal with the selected specific frequency; a programmable frequency divider produces the feedback signal; a current mirror circuit receives the source current for producing a mirror current; a compensation circuit produces a compensation current based on the mirror current for compensating the variation of the damping factor and the bandwidth-to-reference frequency ratio.

15 Claims, 14 Drawing Sheets

$f_{VCO}$ 100MHz

| Band | Vt | Ivco | Isupply (A) | CAP | Phase Noise (dBc) | Noise PWR ($V^2$/Hz) | RMS Jitter | P2P Jitter |
|---|---|---|---|---|---|---|---|---|
| 5 | 0.8 | 2.50E-04 | 5.605 | 7.50E-13 | -87.93 | 4.21E-09 | 1.83E-12 | 1.36E-11 |
| 4 | 0.9 | 4.03E-04 | 6.36 | 1.00E-12 | -90.33 | 2.42E-09 | 1.37E-12 | 1.02E-11 |
| 3 | 1.1 | 7.84E-04 | 8.46 | 1.56E-12 | -93.13 | 1.03E-09 | 8.46E-13 | 6.30E-12 |
| 2 | 1.3 | 1.23E-03 | 10.65 | 2.18E-12 | -94.84 | 8.60E-10 | 6.07E-13 | 4.52E-12 |
| 1 | 1.4 | 1.46E-03 | 11.8 | 2.80E-12 | -97.11 | 5.10E-10 | 5.38E-13 | 4.07E-12 |

FIG. 13

FREQUENCY SYNTHESIS SYSTEM WITH SELF-CALIBRATED LOOP STABILITY AND BANDWIDTH

BACKGROUND OF THE INVENTION

1. Field of the Invention

The present invention relates to the technical field of phase-locked loop (PLL) and, more particularly, to a frequency synthesis system with self-calibrated loop stability and bandwidth.

2. Description of Related Art

In wireless receiving systems, a widely adaptive frequency synthesizer for television receivers, WiMax receivers and the like is a tough challenge on design. For each output frequency of the frequency synthesizer, the parameters (such as the frequency of an input signal, a multiplication factor, etc.) have to be accurately adjusted for minimizing the phase noises and maintaining the stability of the frequency synthesizer.

In the frequency synthesizer, the loop bandwidth indicates the response speed, and preferably is 1/20 of the reference frequency. The damping factor indicates the stability of the frequency synthesizer, and is preferably close to one. The systematic parameters above are related to special circuit parameters such as a charge pump current and the resistance of a filter. Therefore, the loop bandwidth and the damping factor can be varied with input/output frequencies, multiplication factors, and the like.

The various output frequencies and multiplication factors lead to different PLLs on design for different applications. Such a way increases complication in management and also development cost for different PLL designs and tests. A solution for this problem is to apply a complicated circuit and algorithm to the same PLL to meet with the various output frequencies and the multiplication factors. Namely, a single PLL is designed and applicable in different ICs. In such a design, the loop bandwidth and the damping factor require an automatic tuning mechanism to meet with various input frequencies, output frequencies and multiplication factors in different applications.

An adaptive PLL is able to adjust its parameters to meet with the desired output frequencies and multiplication factors. The adaptive PLL can reach a constant bandwidth-to-reference frequency ratio and a constant damping factor, regardless of processes, applied voltages and temperatures. Such features allow the bandwidth to be a fraction of a designed reference frequency, and the fraction is adjusted to reduce the phase noises of the voltage controlled oscillator (VCO), thereby optimizing the output phase noises of the adaptive PLL.

FIG. 1 is a block diagram of a typical PLL 100. In FIG. 1, the PLL 100 includes a phase detector 110, a charge pump 120, a filter 130, a VCO 140 and a frequency divider 150. When the PLL 100 is locked, the frequency of the signal $CK_{OUT}$ produced by the PLL 100 is N times of the frequency of the reference signal $CK_{REF}$.

FIG. 2 is a block diagram of a typical PLL 100 in phase domain. As shown in FIG. 2, in phase domain, the phase detector 110, the charge pump 120 and the filter 130 can be equivalent to $K_d \times K_F \times F(S)$, and the VCO 140 is equivalent to $$\frac{K_{VCO}}{s},$$

where $\Phi_O$ indicates a phase of the output signal $CK_{OUT}$ and $\Phi_I$ indicates a phase of the reference signal $CK_{REF}$. Accordingly, the transfer function $$\frac{\Phi_O}{\Phi_I}$$

can be expressed as:

$$\Delta\Phi \to \Delta I_{CH} \to \Delta V_\phi \to \Delta f \to \Delta\Phi \quad (1)$$

$$\Phi_O = \underbrace{\left(\Phi_I - \frac{\Phi_O}{N}\right)}_{\Delta\Phi} \times I_{CH} \times \underbrace{\left(R + \frac{1}{sC}\right)}_{F(S)} \times K_{VCO} \times \frac{1}{s} \Rightarrow \Phi_O\left(1 + \frac{I_{CH}}{N} \times \frac{F(S)}{s} \times K_{VCO}\right)$$

$$= \Phi_I \times I_{CH} \times \frac{F(S)}{s} \times K_{VCO} \Rightarrow \frac{\Phi_O}{\Phi_I}$$

$$= \frac{I_{CH} \times \frac{F(S)}{s} \times K_{VCO}}{1 + \frac{I_{CH}}{N} \times \frac{F(S)}{s} \times K_{VCO}}$$

$$= \frac{I_{CH} \times \frac{1+sRC}{s^2 \times C} \times K_{VCO}}{1 + \frac{I_{CH}}{N} \times \frac{1+sRC}{s^2 \times C} \times K_{VCO}}$$

$$= \frac{I_{CH} \times (1+sRC) \times K_{VCO}}{s^2 C + \frac{I_{CH}}{N} \times K_{VCO} + s \times \frac{I_{CH}}{N} \times RC \times K_{VCO}}$$

$$= \frac{I_{CH} \times K_{VCO} + I_{CH} \times sRC \times K_{VCO}}{s^2 C + \frac{I_{CH}}{N} \times K_{VCO} + \frac{I_{CH}}{N} \times sRC \times K_{VCO}}$$

$$= N \times \frac{1+sRC}{1+sRC+s^2 \times NC/(I_{CH} \times K_{VCO})}$$

$$= N \frac{1 + 2 \times \varsigma \times (s/\omega_n)}{1 + 2 \times \varsigma \times (s/\omega_n) + (s/\omega_n)^2},$$

where $\omega_n$ and $\varsigma$ can be expressed as:

$$\omega_n = \sqrt{\frac{I_{CH} \times K_{VCO}}{N \times C}} \quad (2)$$

$$\varsigma = \frac{1}{2}\sqrt{\frac{1}{N} \times I_{CH} \times K_{VCO} \times R^2 \times C},$$

for $\omega_n$ indicates the loop bandwidth and $\varsigma$ indicates the damping factor. In a typical application, $I_{CH}$ is proportional to N in order to reduce the affection from the variation of the value N. However, a PLL product typically requires a constant loop bandwidth $$\frac{\omega_n}{\omega_{REF}}$$

and a constant damping factor $\varsigma$. From equation (2), it is known that is not a constant, and the loop bandwidth $\omega_n$ and the damping factor $\zeta$ are a function of the circuit parameters of the PLL 100. However, the loop bandwidth $$\frac{\omega_n}{\omega_{REF}}$$

and the damping factor $\zeta$ shown in equation (2) should be constant for different applications.

In addition, the PLL needs to provide a frequency range which is large enough. For example, a required frequency ranges in 10 to 100 MHz for a video processor and in few hundreds KHz for an audio processor, and in this case the corresponding processor requires a frequency which ranges from 500 MHz to 1 GHz, so the output frequency range is increased up to 3000 to 10000 times (a tunable multiplier of the VCO output frequency, ex: 1000M/100 kHz=10000). Due to the various output frequencies, it requires different PLL designs for different applications. Such a way increases the managing trouble and the developing cost for designing and testing the different PLLs. Another solution is to design a single PLL applicable for different ICs, but how to design a PLL for a wideband operation is a challenge.

When the frequency requirement is met, another challenge is in the purity of the PLL output frequency, i.e., the output jitter, or known as the phase noise, in terms of characterized specification.

The PLL can produce a pure and stable clock, but noises can affect the clock stability. The degree affected by the noises can be decided by measuring the amount of PLL output jitter. The PLL output jitter typically includes cycle-to-cycle jitter, periodic jitter and long-term jitter.

After the system is operated for a long time, the long-term jitter may affect the system significantly. The long-term jitter often makes the system working point drift. The periodic jitter is caused by the imbalance or current leakage of a charge pump, which produces a static phase offset between the output signal and a reference signal. In the deep submicron technology, due to the shortened processes, the current leakage is increased exponentially. In addition, for a low voltage and wide operating range requirement, a typical PLL has a very high VCO regulation sensitivity, which makes the periodic jitter become worse. The long-term jitter is caused by a VCO phase error. Namely, a current output signal accumulates the long-term jitter at each transition due to the accumulation feature of the phase error and the leading variation of a previous output signal in time axis.

Accordingly, there still are problems existed in the conventional frequency synthesis systems, and thus it is desirable to provide an improved frequency synthesis system to mitigate and/or obviate the aforementioned problems.

SUMMARY OF THE INVENTION

A first object of the present invention is to provide a frequency synthesis system with self-calibrated loop stability and bandwidth, in which a damping factor and a bandwidth-to-reference frequency ratio $$\frac{\omega_n}{\omega_{REF}}$$

is independent of a value of frequency division of a programmable frequency divider.

A second object of the present invention is to provide a frequency synthesis system with self-calibrated loop stability and bandwidth, which is capable of receiving different input reference frequencies in order to allow a damping factor $\zeta$ and a bandwidth-to-reference frequency ratio $$\frac{\omega_n}{\omega_{REF}}$$

to be designed constants, thereby obtaining the response speed optimization and the stability.

A third object of the present invention is to provide a frequency synthesis system with self-calibrated loop stability and bandwidth, which compensates a controllable oscillator and selects an output signal when the output signal presents a wideband distribution, and the damping factor and the bandwidth-to-reference frequency ratio are sharply changed. Therefore, the damping factor $\zeta$ and the bandwidth-to-reference frequency ratio $$\frac{\omega_n}{\omega_{REF}}$$

are provided with the best system response speed and stability by means of the compensation technique.

A fourth object of the present invention is to provide a frequency synthesis system with self-calibrated loop stability and bandwidth, which allows a discrete time loop filter to be implemented with a small area into an integrated circuit.

A fifth object of the present invention is to provide a frequency synthesis system with self-calibrated loop stability and bandwidth, which has low jitter and wideband features and can be operated in a low voltage environment.

A sixth object of the present invention is to provide a frequency synthesis system with self-calibrated loop stability and bandwidth, which includes a capacitance bank controller to dynamically set a capacitance bank to a value to thereby provide more load capacitance to each stage of delay and eliminate more phase error from a VCO.

To achieve the objects, a frequency synthesis system with self-calibrated loop stability and bandwidth is provided, which includes a detector, a charge pump, a filter, a bias circuit, a controllable oscillator, a differential-to-single converter, a programmable frequency divider, a current mirror circuit and a compensation circuit. The detector receives an input signal and a feedback signal and produces a detection signal based on a logic level difference between the input signal and the feedback signal. The charge pump is connected to the detector in order to produce a control signal based on the detection signal and a compensation current. The filter is connected to the charge pump in order to produce a tuning signal and a source current based on the control signal. The bias circuit is connected to the filter in order to produce a first bias signal and a second bias signal based on the tuning signal. The controllable oscillator is connected to the bias circuit in order to produce a differential output signal with a selected specific frequency based on the first and second bias signals. The differential-to-single converter is connected to the controllable oscillator in order to convert the differential output signal into an output signal with the selected specific frequency. The programmable frequency divider is connected to the differential-to-single converter in order to produce the feedback signal based on the output signal. The current mirror circuit receives the source current in order to produce a mirror current. The compensation circuit is connected to the current mirror circuit in order to produce the compensation current based on the mirror current for compensating a variation of a damping factor and a bandwidth-to-reference frequency ratio when the controllable oscillator outputs the output signal.

Other objects, advantages, and novel features of the invention will become more apparent from the following detailed description when taken in conjunction with the accompanying drawings.

BRIEF DESCRIPTION OF THE DRAWINGS

FIG. 13 is a table of parameters at different bands according to an embodiment of the invention;

DETAILED DESCRIPTION OF THE PREFERRED EMBODIMENT

Figure 3:
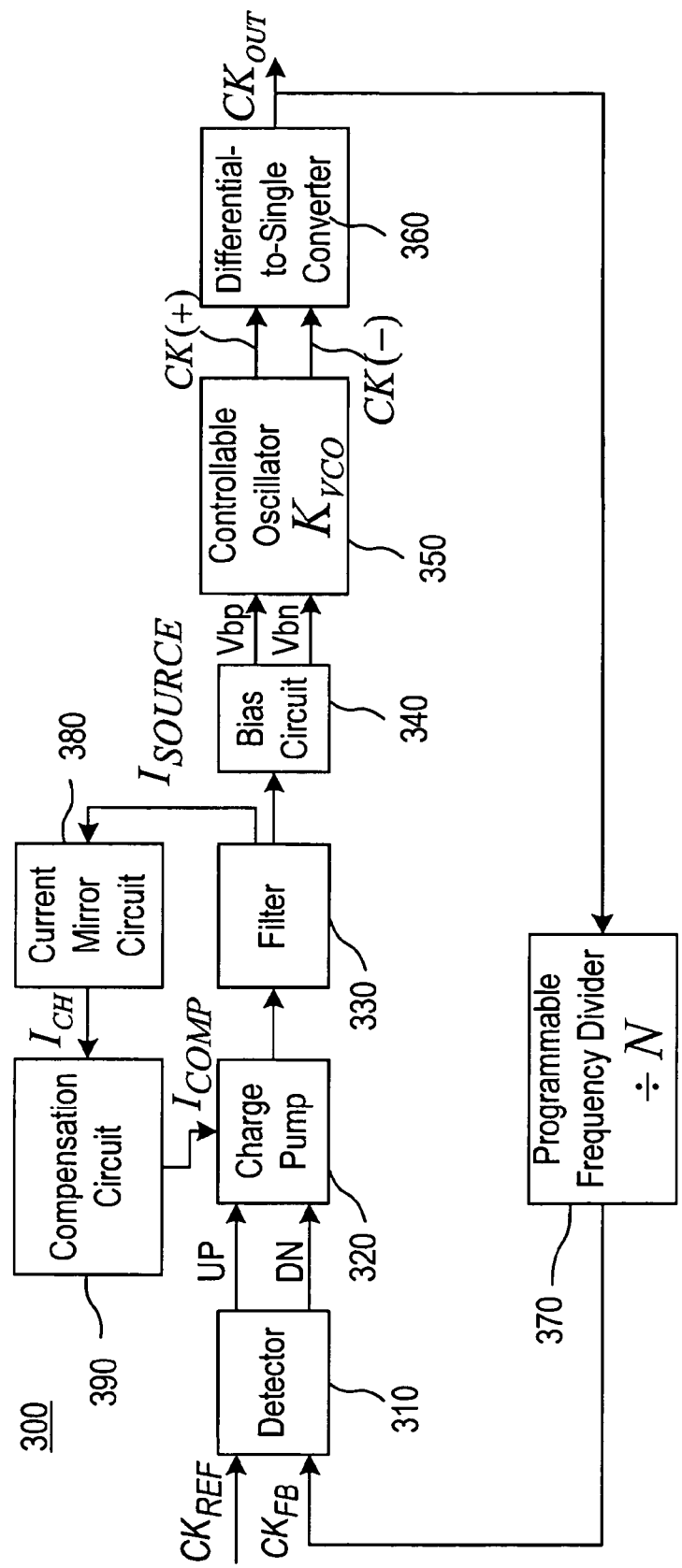
FIG. 3 is a block diagram of a frequency synthesis system with self-calibrated loop stability and bandwidth according to an embodiment of the invention.

FIG. 3 is a block diagram of a frequency synthesis system 300 with self-calibrated loop stability and bandwidth according to an embodiment of the invention. The system 300 produces an output signal based on an input signal. In FIG. 3, the system 300 includes a detector 310, a charge pump 320, a filter 330, a bias circuit 340, a controllable oscillator 350, a differential-to-single converter 360, a programmable frequency divider 370, a current mirror circuit 380 and a compensation circuit 390.

The detector 310 produces a detection signal based on a logic level difference between the input signal $CK_{REF}$ and a feedback signal $CK_{FB}$. The detector 310 adjusts the detection signal based on a phase leading or lagging relationship between the input signal $CK_{REF}$ and the feedback signal $CK_{FB}$. The detection signal includes a frequency up signal UP and a frequency down signal DN.

When the phase of the input signal $CK_{REF}$ lags that of the feedback signal $CK_{FB}$, the detector 310 outputs the frequency up signal UP to activate the charge pump 320 to charge a capacitor (not shown). The voltage of the capacitor is increased due to the charging operation. When the voltage of the capacitor is increased, the frequency $f_{VCO}$ of the output signal $CK_{OUT}$ of the controllable oscillator 350 is also increased to compensate the lagging phase of the input signal $CK_{REF}$. When the phase of the input signal $CK_{REF}$ leads that of the feedback signal $CK_{FB}$, the detector 310 outputs the frequency down signal DN to activate the charge pump 320 to thus discharge the capacitor. The voltage of the capacitor is decreased due to the discharging operation. When the voltage of the capacitor is decreased, the frequency $f_{VCO}$ of the output signal $CK_{OUT}$ of the controllable oscillator 350 is also decreased to pull the leading phase of the input signal $CK_{REF}$ back to a position as same as the phase of the feedback signal $CK_{FB}$.

The charge pump 320 is connected to the detector 310 in order to produce a control signal based on the detection signal.

The filter 330 is connected to the charge pump 320 in order to produce a tuning signal based on the control signal. The filter 330 can be a discrete time loop filter, and the discrete time loop filter is a low pass filter. The low pass filter filters out the high frequency component of the control signal to thereby produce the tuning signal and a source current $I_{SOURCE}$.

Figure 4:
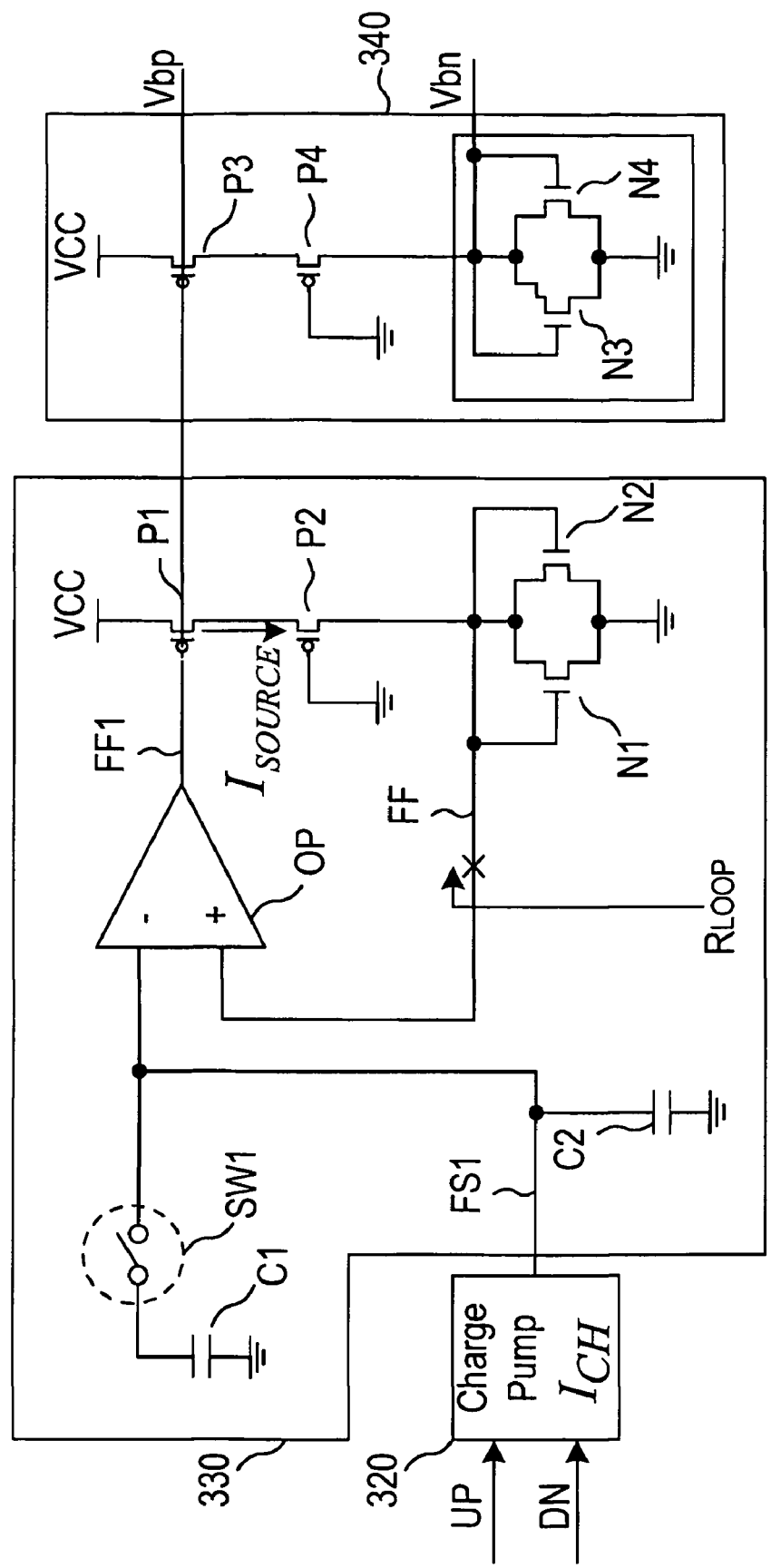
FIG. 4 is a circuit diagram of a low pass filter (LPF) and a bias circuit according to an embodiment of the invention.

FIG. 4 is a circuit diagram of the low pass filter (LPF) 330 and the bias circuit 340 according to an embodiment of the invention. The LPF 330 includes a first capacitor C1, a second capacitor C2, a first switch SW1, an operational amplifier OP, a first NMOS transistor N1, a second NMOS transistor N2, a first PMOS transistor P1 and a second PMOS transistor P2. In FIG. 4, as compared with the cascaded constant resistor and constant capacitor shown in FIG. 1, the second capacitor C2, the first switch SW1, the operational amplifier OP, the first NMOS transistor N1, the second NMOS transistor N2, the first PMOS transistor P1 and the second PMOS transistor P2 form an equivalent resistor, which is referred to as a $1/g_m$ resistor. The $1/g_m$ resistor has a resistance proportional to the period $T_{VCO}$ of the output signal $CK_{OUT}$.

As shown in FIG. 4, the second capacitor C2 has one end connected to the charge pump 320, one end of the first switch SW1 and an inverting input terminal of the operational amplifier OP through a terminal FS1, and the other end connected to a low voltage. The first switch SW1 has the other end connected to one end of the first capacitor C1. The first capacitor C1 has the other end connected to the low voltage. The operational amplifier OP has an output terminal connected to a gate of the first PMOS transistor P1. The first PMOS transistor P1 has a source connected to a high voltage VCC. The drain of the first PMOS transistor P1 is connected to the source of the second PMOS transistor P2. The second PMOS transistor P2 has a gate connected to the low voltage. The drain of the second PMOS transistor P2 is connected to the non-inverting input terminal of the operational amplifier OP, the gate and drain of the first NMOS transistor N1 and the gate and drain of the second NMOS transistor N2. The sources of the first NMOS transistor N1 and the second NMOS transistor N2 are connected to the low voltage. A terminal FF1 is connected to a next stage circuit. Namely, the tuning signal is outputted to the bias circuit 340 through the terminal FF1.

The bias circuit 340 is connected to the filter 330 in order to produce a first bias signal Vbp and a second bias signal Vbn based on the tuning signal. The bias circuit 340 includes a third PMOS transistor P3, a fourth PMOS transistor P4, a third NMOS transistor N3 and a fourth NMOS transistor N4.

As shown in FIG. 4, the operational amplifier OP has the output terminal connected to a gate of the third PMOS transistor P3. The third PMOS transistor P3 has a source connected to a high voltage, and a drain connected to a source of the fourth PMOS transistor P4. The fourth PMOS transistor P4 has a gate connected to the low voltage, and a drain connected to gates and drains of the third and the fourth NMOS transistors N3 and N4. The sources of the third and the fourth NMOS transistors N3 and N4 are connected to the low voltage.

Figure 5:
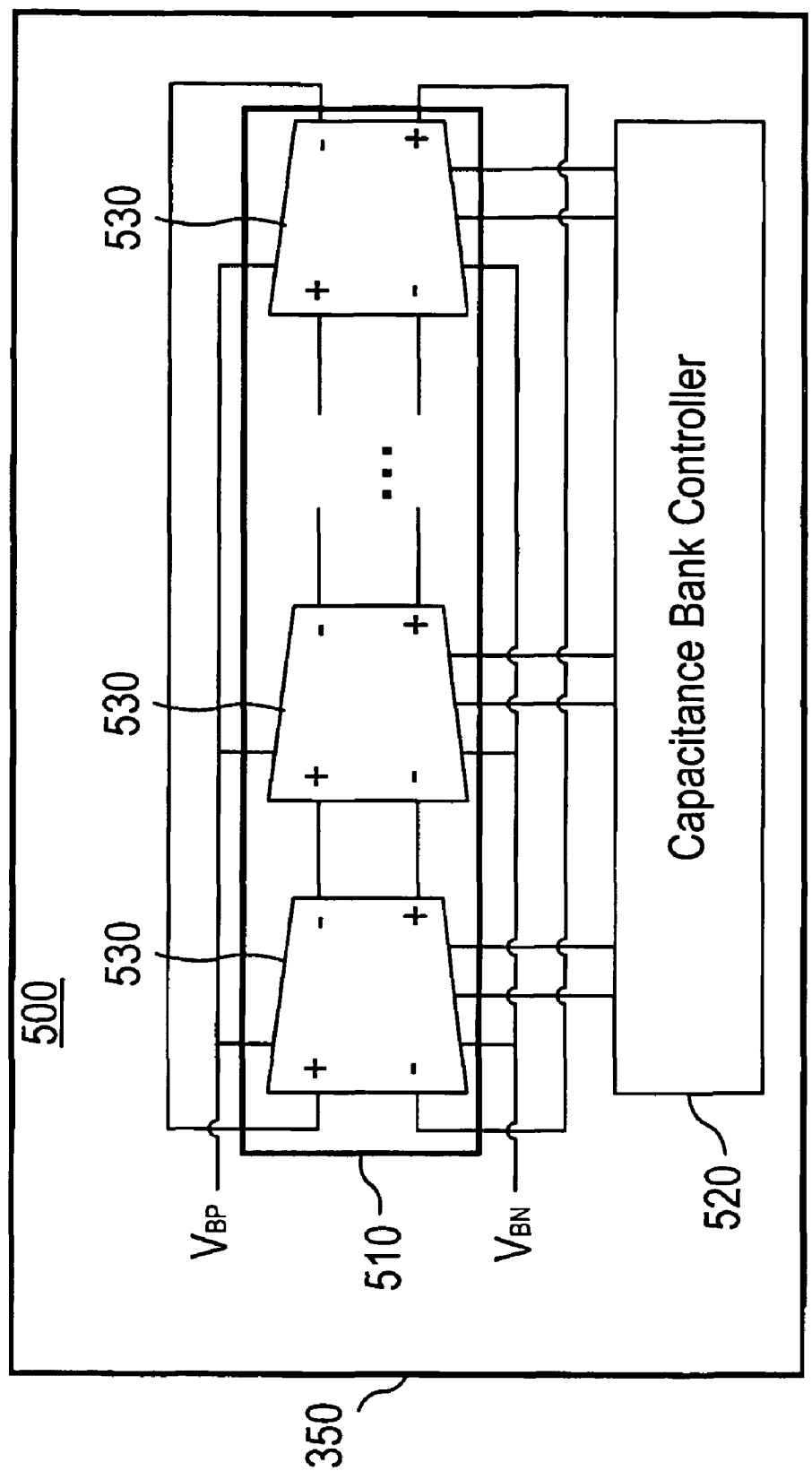
FIG. 5 is a block diagram of an oscillation circuit according to an embodiment of the invention.

The controllable oscillator 350 is connected to the bias circuit 340 in order to produce a differential output signal CK(+), CK(−) based on the first and the second bias signals. FIG. 5 is a block diagram of the controllable oscillator 350 according to an embodiment of the invention.

The controllable oscillator 350 includes an oscillation circuit 500 to produce the differential output signal CK(+), CK(−) with a selected specific frequency.

FIG. 5 is a block diagram of the oscillation circuit 500 according to an embodiment of the invention. As shown in FIG. 5, the oscillation circuit 500 includes an oscillator 510 and a capacitance bank controller 520.

The oscillator 510 is comprised of a plurality of delay cells 530 to thereby produce the differential output signal CK(+), CK(−) with the selected specific frequency. The capacitance bank controller 520 is connected to the delay cells 530 in order to control the delay cells 530 of the oscillator 510 to thereby produce the differential output signal CK(+), CK(−) with the selected specific frequency.

Figure 6:
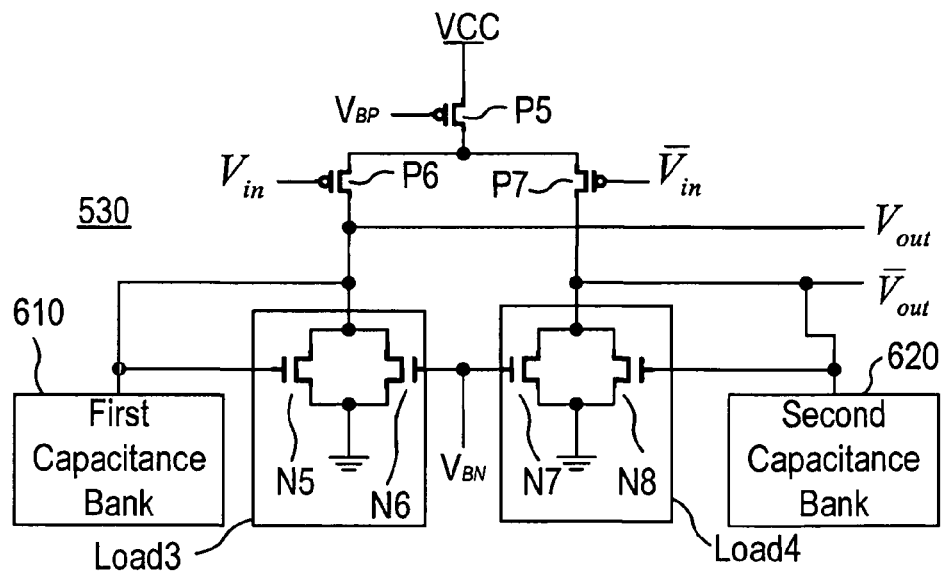
FIG. 6 is a block diagram of a delay cell according to an embodiment of the invention.

FIG. 6 is the block diagram of each of the delay cells 530 according to an embodiment of the invention. As shown in FIG. 6, each delay cell 530 includes a fifth PMOS transistor P5, a sixth PMOS transistor P6, a seventh PMOS transistor P7, a third symmetric load Load3, a fourth symmetric load Load4, a first capacitance bank 610 and a second capacitance bank 620. The third symmetric load has a fifth NMOS transistor N5 and a sixth NMOS transistor N6. The fourth symmetric load has a seventh NMOS transistor N7 and an eighth NMOS transistor N8.

The fifth PMOS transistor P5 has a source connected to the high voltage, a gate connected to the first bias signal $V_{BP}$, and a drain connected to sources of the sixth and the seventh PMOS transistors P6 and P7. The sixth PMOS transistor P6 has a drain connected to the drain and gate of the fifth NMOS transistor N5 and the drain of the sixth NMOS transistor N6. The seventh PMOS transistor P7 has a drain connected to the drain and gate of the eight NMOS transistor N8 and the drain of the seventh NMOS transistor N7. The gates of the sixth and the seventh NMOS transistor N6 and N7 are connected to the second bias signal $V_{BN}$. The sources of the fifth, the sixth, the seventh and the eighth NMOS transistors N5, N6, N7 and N8 are connected to the low voltage. The first capacitance bank 610 is connected to the gate of the fifth NMOS transistor N5, and the second capacitance bank 620 is connected to the gate of the eighth NMOS transistor N8.

Figure 7:
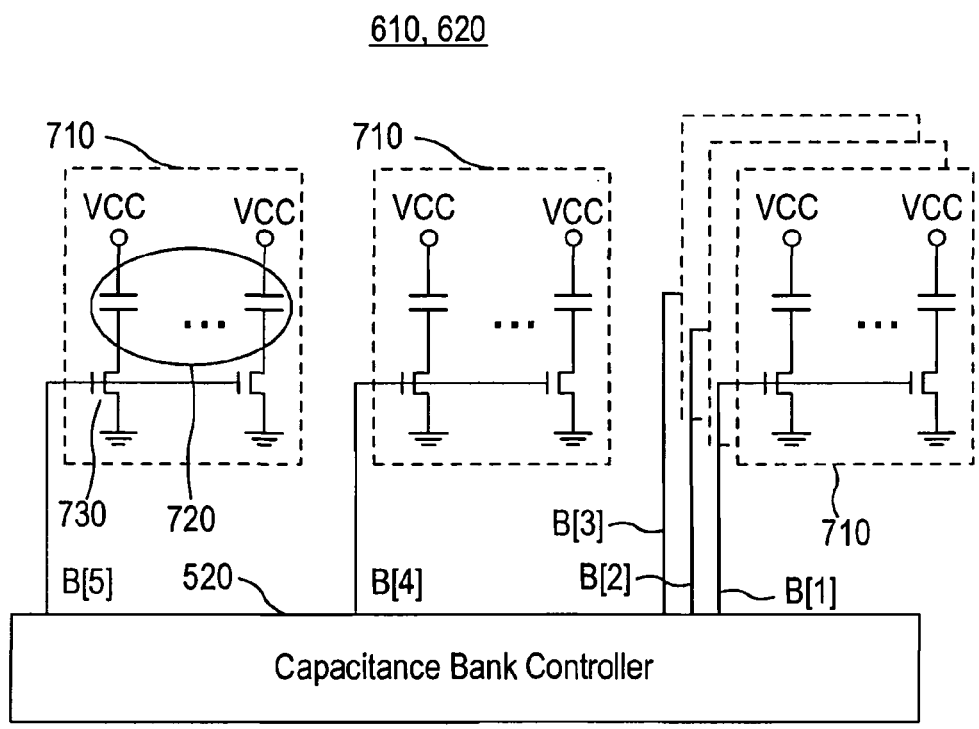
FIG. 7 is a circuit diagram of first and second capacitance banks according to an embodiment of the invention.

FIG. 7 is a circuit diagram of each of the first and the second capacitance banks 610 and 620 according to an embodiment of the invention. As shown in FIG. 7, each of the first and the second capacitance banks 610 and 620 includes a plurality of capacitance selectors 710, and each capacitance selector 710 has N capacitors 720 and N switches 730, where N is an integer larger than 1.

Each of the N switches 730 of every capacitance selector is an NMOS transistor with a gate connected to the capacitance bank controller 520.

In this embodiment, the capacitors of each capacitance selector 710 can be one selected from a group consisting of base-emitter junction capacitors, MOSFET capacitors and poly-poly capacitors. In other embodiments, the capacitors of each capacitance selector 710 can be metal-insulator-metal (MIM) capacitors.

As shown in FIG. 7, the capacitors ($C_{B1}$-$C_{B5}$) of each of the first and the second capacitance banks 610 and 620 can be expressed as:

$$(C_{Paracitic}+B[1] \times C_{B1}+B[2] \times C_{B2}+B[3] \times C_{B3}+B[4] \times C_{B4}+B[5] \times C_{B5}),$$

where $C_{Paracitic}$ indicates parasitic and stray capacitance, and B[1],B[2],B[3],B[4],B[5] indicate control signals outputted from the capacitance bank controller 520 to each of the first and the second capacitance banks 610 and 620. When B[j]=0 (for j=1 to 5), the corresponding NMOS transistors are turned off, and the capacitors ($C_{B1}$-$C_{B5}$) are considered to be floating and accordingly do not work. When B[j]=1, the corresponding NMOS transistors are turned on, and the capacitors ($C_{B1}$-$C_{B5}$) are considered to be grounded to thereby produce the capacitance effect. Thus, the frequency $f_{VCO}$ of the differential output signal CK(+), CK(−) outputted by the controllable oscillator 350 is expressed as:

$$f_{VCO} = \frac{g_m}{C_B}$$

$$= \frac{g_m}{2n \times C_{Eff}}$$

$$= \frac{g_m}{2n \times \left( \begin{array}{c} C_{Paracitic} + B[1] \times C_{B1} + B[2] \times C_{B2} + \\ B[3] \times C_{B3} + B[4] \times C_{B4} + B[5] \times C_{B5} \end{array} \right)}.$$

The differential-to-single converter 360 is connected to the controllable oscillator 350 in order to convert the differential output signal CK(+), CK(−) into an output signal $CK_{OUT}$. The differential-to-single converter 360 can be replaced with a frequency divider with a divisor of two in order to improve the positive and negative edge symmetry (50% duty cycle) of the output signal $CK_{OUT}$.

The programmable frequency divider 370 is connected to the differential-to-single converter 360 in order to produce the feedback signal $CK_{FB}$ based on the output signal $CK_{OUT}$.

Figure 8:
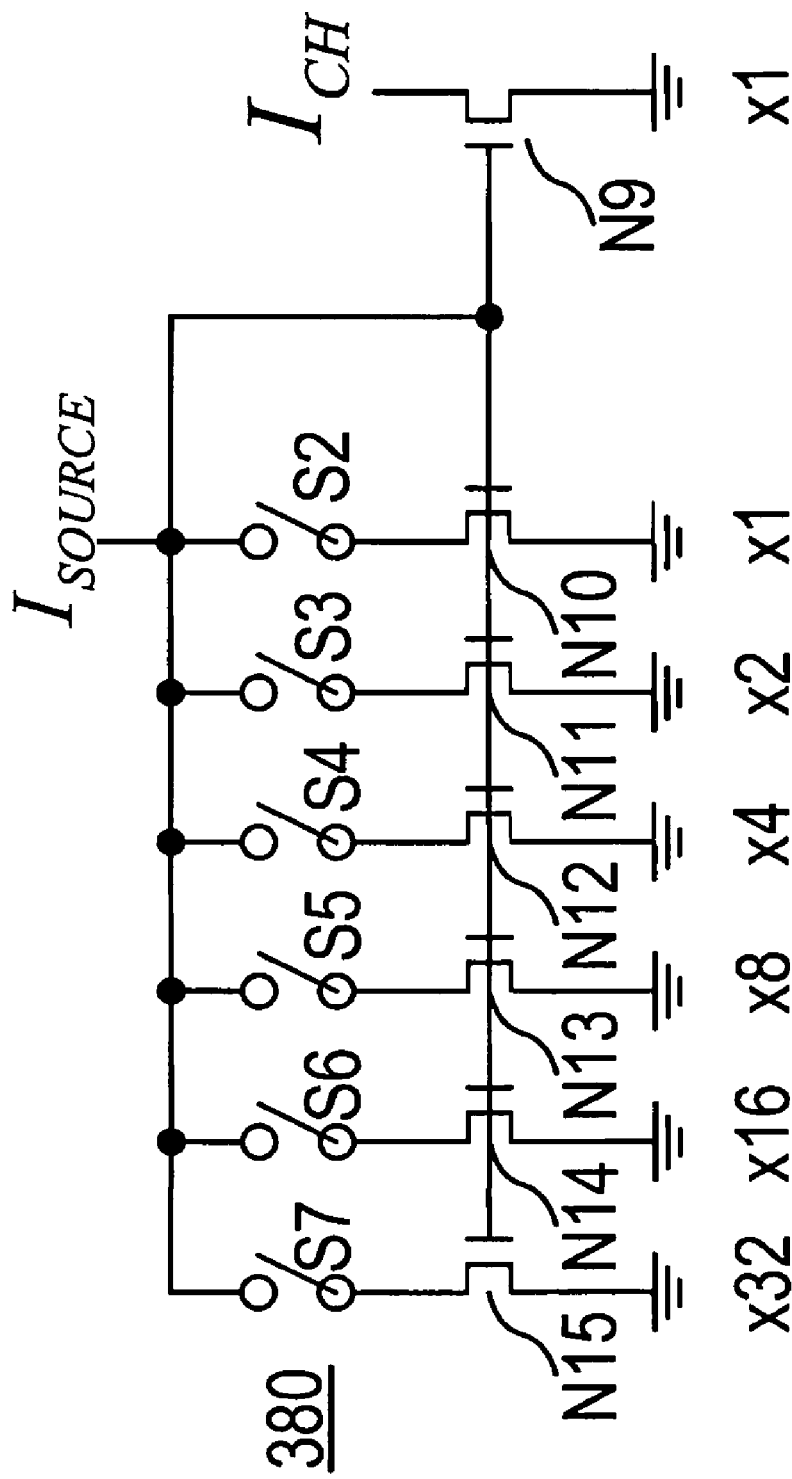
FIG. 8 is a circuit diagram of a current mirror circuit according to an embodiment of the invention.

The current mirror circuit 380 receives a source current $I_{SOURCE}$ to thereby produce a mirror current $I_{CH}$. FIG. 8 is a diagram of the current mirror circuit 380 according to an embodiment of the invention. As shown in FIG. 8, the current mirror circuit 380 includes ninth to fifteenth NMOS transistors N9-N15 and second to seventh switches SW2-SW7. The ninth NMOS transistor N9 and the tenth NMOS transistor N10 have the same size, the tenth NMOS transistor N10 has a size double to the eleventh NMOS transistor N11, the eleventh NMOS transistor N11 has a size double to the twelfth NMOS transistor N12, and so on. The second to seventh switches SW2-SW7 are commonly used by the programmable frequency divider 370 and externally controlled for determining a divisor N of the programmable frequency divider 370.

The mirror current $I_{CH}$ is x times of the source current $I_{SOURCE}$, such that $$x = \frac{1}{N},$$

where N indicates the divisor of the programmable frequency divider 370, i.e., $$I_{CH} = x \times I_{SOURCE} = \frac{1}{N} \times I_{SOURCE}.$$

When the second switch SW2 and the third switch SW3 are turned on and the remaining switches SW4-SW7 are off, $I_{CH} = \frac{1}{3} I_{SOURCE}$ and in this case N=3. Namely, the mirror current $I_{CH}$ in FIG. 8 can be expressed as:

$$I_{CH} = \left( \frac{1}{2^0 \times S[2] + 2^1 \times S[3] + 2^2 \times S[4] + 2^3 \times S[5] + 2^4 \times S[6] + 2^5 \times S[7]} \right) \times I_{SOURCE},$$

where S[2]=1 when the second switch SW2 is turned on, S[2]=0 when the second switch SW2 is turned off, S[3]=1 when the third switch SW3 is turned on, S[3]=0 when the third switch SW3 is turned off, and so on.

The compensation circuit 390 is connected to the charge pump 320 and the current mirror circuit 380 in order to produce a compensation current $I_{COMP}$ based on the mirror current $I_{CH}$. The compensation current $I_{COMP}$ is a charge pump current substantially used in the charge pump 320 for compensating the variation of the damping factor and the bandwidth-to-reference frequency ratio caused by the sharp capacitance variation of the first and the second capacitance banks 610 and 620. The relation between the compensation current $I_{COMP}$ and the mirror current $I_{CH}$ is expressed as $$I_{COMP} = \frac{1}{\Psi} I_{CH}$$

where $\Psi$ indicates a designed fraction or positive integer.

Figure 9:
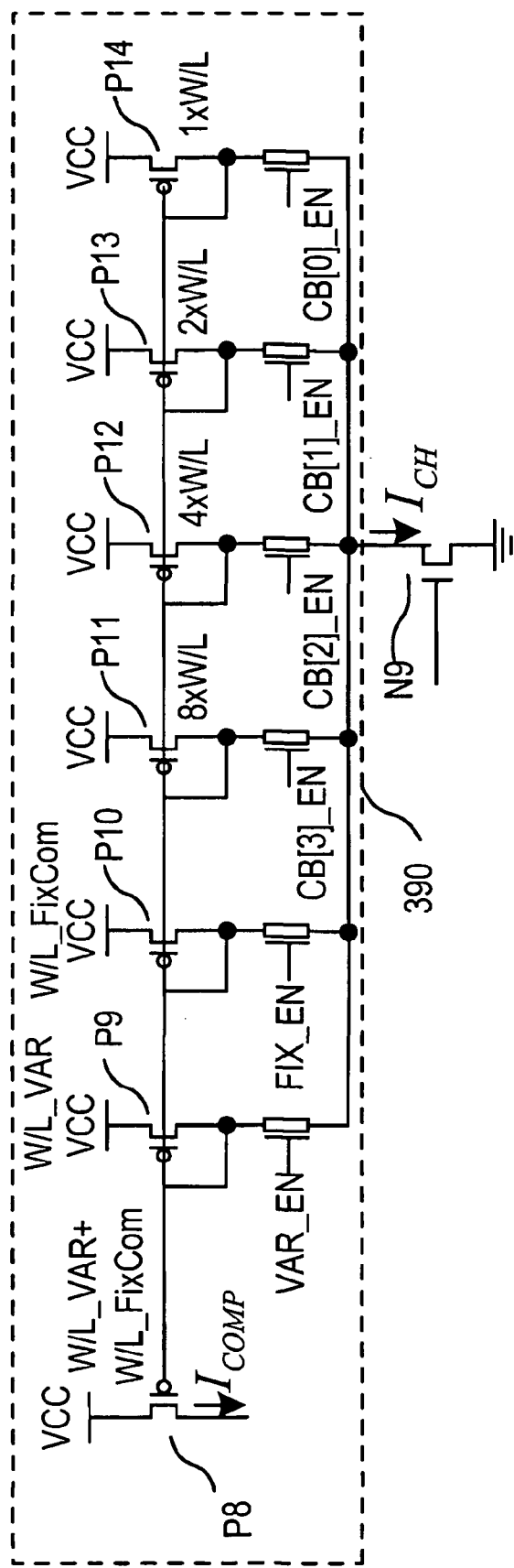
FIG. 9 is a circuit diagram of a compensation circuit according to an embodiment of the invention.

FIG. 9 is a schematic diagram of the compensation circuit 390 according to an embodiment of the invention. As shown in FIG. 9, the compensation circuit 390 is comprised of eighth to fourteenth PMOS transistors P8 to P14 and enable switches VAR_EN, FIX_EN, CB[3]_EN, CB[2]_EN, CB[1]_EN, CB[0]_EN. The thirteenth PMOS transistor P13 has a size double to the fourteenth PMOS transistor P14, the twelfth PMOS transistor P12 has a size double to the thirteenth PMOS transistor P13, and the eleventh PMOS transistor P11 has a size double to the twelfth PMOS transistor P12.

In this embodiment, the compensation circuit 390 is based on the mirror current $I_{CH}$ to produce the compensation current $I_{COMP}$ for compensating the variation of the damping factor $\zeta$ and the bandwidth-to-reference frequency ratio $$\frac{\omega_n}{\omega_{REF}}$$

when the controllable oscillator 350 outputs the differential output signal CK(+), CK(−) with the selected specific frequency $f_{VCO}$, where the compensation current $I_{COMP}$ is 1/$\Psi$ times of the mirror current $I_{CH}$, i.e., $$I_{COMP} = \frac{1}{\Psi} I_{CH}.$$

From Equation (3), it is known that $$f_{VCO} = \frac{g_m}{C_B} = \frac{g_m}{2n \times C_{Eff}} \text{ and } K_{VCO} = \frac{\beta}{C_B}.$$

Namely, Equation (2) can be rewritten into:

$$\zeta = \frac{1}{2} \sqrt{\frac{1}{N} \times I_{CH} \times K_{VCO} \times C_1 \times R_{Loop}} \tag{4}$$

$$= \frac{1}{2} \sqrt{\frac{1}{N} \times x \times (2 \times I_{COMPEN}) \times K_{VCO} \times C_1} \times \left\{ \frac{y}{\frac{2 \times g_m}{R_{loop}}} \right\}$$

$$= \frac{1}{2} \sqrt{\frac{1}{N} \times x \times (2 I_{COMPEN}) \times C_1} \times \left\{ \frac{1}{2 g_{m_p}} \times \frac{1}{2} \frac{2 g_{m_p}}{C_2} \times \left( N \times \frac{C_B}{\sqrt{2\beta \times I_D}} \right) \right\} \times \sqrt{\frac{\beta}{C_B}}$$

$$\propto \sqrt{\frac{C_1 \times 2n \times (C_{Paracitic} + B[1] \times C_{B1} + B[2] \times C_{B2} + B[3] \times C_{B3} + B[4] \times C_{B4} + B[5] \times C_{B5})}{C_2^2}} \times \sqrt{\frac{I_{COMP}}{I_D}}$$

Upon Equation (3) for a controllable oscillator in a wide-band system, the system stability becomes a serious problem. However, when $$I_{COMP} = \frac{1}{\Psi} I_{CH},$$

the compensation current $I_{COMP}$ can be expressed as:

$$I_{COMP} = \frac{1}{\Psi} \times I_D. \tag{5}$$

Therefore, equation (5) can be rewritten into:

$$\zeta \propto \sqrt{\frac{C_1 \times 2n \times (C_{Paracitic} + B[1] \times C_{B1} + B[2] \times C_{B2} + B[3] \times C_{B3} + B[4] \times C_{B4} + B[5] \times C_{B5})}{C_2^2}} \times \sqrt{\frac{I_{COMP}}{I_D}}, \quad (6)$$

$$\zeta \propto \sqrt{(C_{Paracitic} + B[1] \times C_{B1} + B[2] \times C_{B2} + B[3] \times C_{B3} + B[4] \times C_{B4} + B[5] \times C_{B5})} \times \sqrt{\frac{1}{\Psi}}$$

Accordingly, by means of an appropriate design, the invention can use the factor $\Psi$ to compensate the variation of the damping factor $\zeta$ and the bandwidth-to-reference frequency ratio $$\frac{\omega_n}{\omega_{REF}}$$

when the controllable oscillator 350 outputs the differential output signal CK(+), CK(−) with the selected specific frequency $f_{VCO}$. The relation in equation (6) can be generated by the compensation circuit 390.

As shown in FIG. 7, the capacitors of the first and the second capacitance banks 610 and 620 can be expressed as:

$$(C_{Paracitic} + B[1] \times C_{B1} + B[2] \times C_{B2} + B[3] \times C_{B3} + B[4] \times C_{B4} + B[5] \times C_{B5})$$

As shown in FIG. 9, the factor $\Psi$ can be expressed as:

$$\Psi = \frac{A_0 \frac{W}{L_{VAR}} + A_1 \frac{W}{L_{FIX}} + CB[0] \times B_0 \frac{W}{L_{B[0]}}}{A_0 \frac{W}{L_{VAR}} + A_1 \frac{W}{L_{FIX}}} + \quad (7)$$

$$\frac{CB[1] \times B_1 \frac{W}{L_{B[1]}} + CB[2] \times B_2 \frac{W}{L_{B[2]}} + CB[3] \times B_3 \frac{W}{L_{B[3]}}}{A_0 \frac{W}{L_{VAR}} + A_1 \frac{W}{L_{FIX}}},$$

where the factor $\Psi$ can compensate the variation of the damping factor $\zeta$ and the bandwidth-to-reference frequency ratio $$\frac{\omega_n}{\omega_{REF}}$$

when the controllable oscillator 350 outputs the differential output signal CK(+), CK(−) with the selected specific frequency $f_{VCO}$. The width to length ratios of the transistors P9 and P14 in FIG. 9 meet with $$\frac{\frac{W}{L_{VAR}}}{\frac{W}{L}} = \frac{C_{VAR}}{C_\mu},$$

the width to length ratios of the transistors P10 and P14 meet with $$\frac{\frac{W}{L_{Fix}}}{\frac{W}{L}} = \frac{C_{Fix}}{C_\mu},$$

and the size of the eighth PMOS transistor P8 is as same as that of the shunt transistors P9 and P10, i.e., $$\frac{W}{L_{P5}} = \frac{W}{L_{VAR}} + \frac{W}{L_{FixCom}}.$$

Therefore, the damping factor $\zeta$ and the bandwidth-to-reference frequency ratio $$\frac{\omega_n}{\omega_{REF}}$$

are fixed in the subbands after the compensation. Namely, the damping factor $\zeta$ and the bandwidth-to-reference frequency ratio $$\frac{\omega_n}{\omega_{REF}}$$

have the same system response speed and stability in the subbands.

Figure 1:
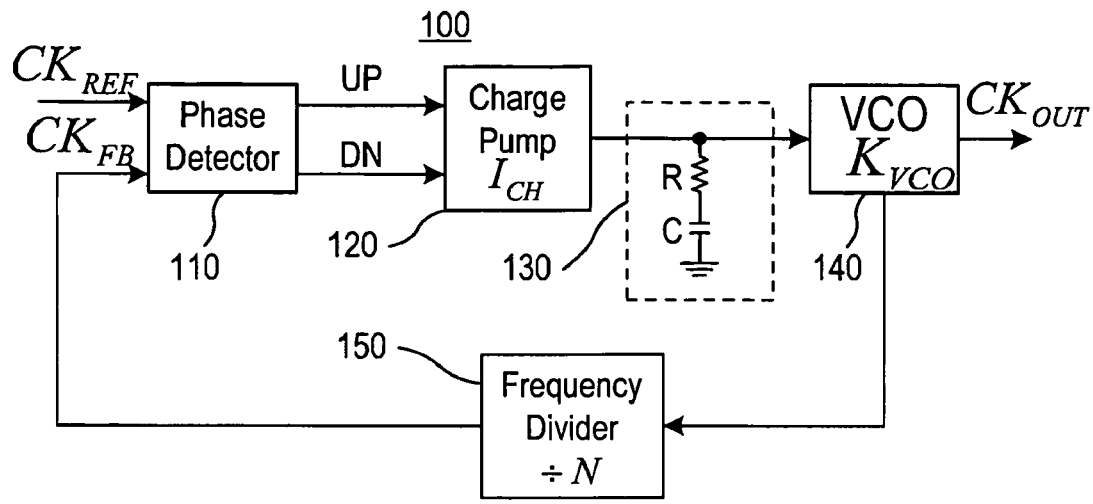
FIG. 1 is a block diagram of a typical phase locked loop (PLL)
Figure 2:
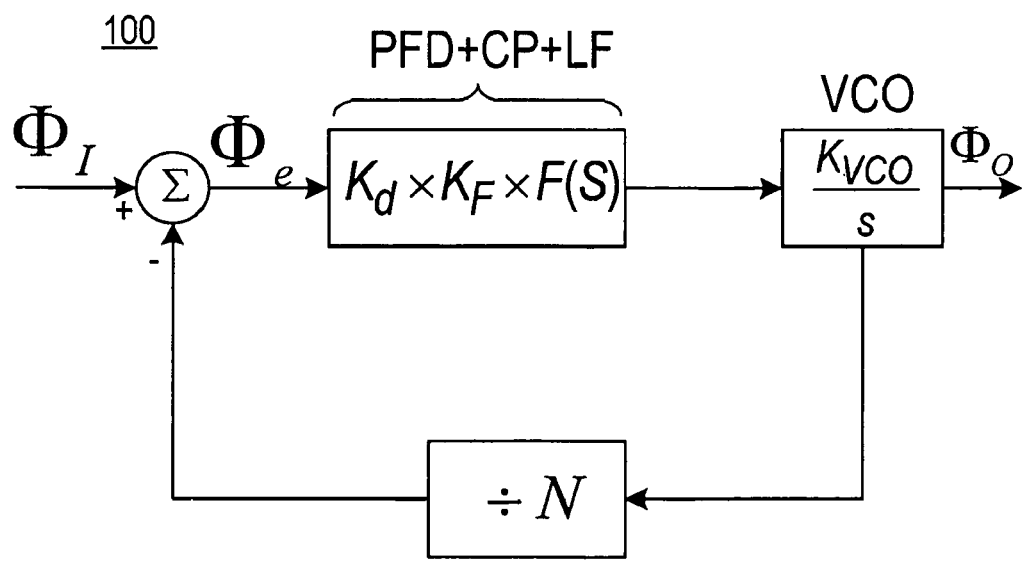
FIG. 2 is a block diagram of a typical phase locked loop (PLL) in phase domain.

For illustrating how the invention eliminates the disadvantages in the prior art and reaches to the objects, a comparative analysis between the invention and the prior art is done as follows. From Equation (2) above, it is known that the prior loop bandwidth $\omega_n$ and the damping factor $\zeta$ are fixed to thereby keep the charge pump reference current $I_{CH}$ proportional to N and not adjustable for different applications. In this case, $$\frac{\omega_n}{\omega_{REF}}$$

is not a constant and not changeable based on the frequency of the reference signal, so the system response speed is not optimized and the presentation of stability limitation on the bandwidth smaller than 1/10 of the reference signal is unavoidable. To overcome this, the fixed resistor R in FIG. 1 is replaced with a discrete time loop filter to thereby produce a switch capacitor equivalent resistor $R_{eq}$.

Also, the charge pump reference current $I_{CH}$ is adjusted as x times of the source current $I_{SOURCE}$, i.e., the switch capacitor equivalent resistor $R_{eq}$ is expressed as:

$$R_{eq} = \frac{1}{f_{REF} \times C_S} = \frac{N}{f_{VCO} \times C_S}, \quad (8)$$

and after the adjustment, the charge pump reference current becomes:

$$I_{CH} = x \times I_{SOURCE}. \quad (9)$$

Taking equation (8) and equation (9) into equation (2), it is found:

$$\omega_N = \sqrt{\frac{I_{CH} \times K_{VCO}}{N \times C}} \quad (10)$$

$$\Rightarrow \frac{\omega_N}{\omega_{REF}} = \frac{\sqrt{\frac{(x \times I_{SOURCE}) \times K_{VCO}}{N \times C}}}{2\pi \times f_{VCO}/N}$$

$$\Rightarrow \frac{\omega_N}{\omega_{REF}} = \frac{\sqrt{(x \times N \times I_{SOURCE}) \times K_{VCO}/C}}{2\pi \times f_{VCO}}$$

$$\Rightarrow \frac{\omega_N}{\omega_{REF}} \propto \sqrt{x \times N},$$

and similarly, $$\zeta = \frac{1}{2}\sqrt{\frac{1}{N} \times I_{CH} \times K_{VCO} \times R^2 \times C} \quad (11)$$

$$\Rightarrow \frac{1}{2}\sqrt{\frac{1}{N}(x \times I_{SOURCE}) \times K_{VCO} \times C} \times \frac{N}{f_{VCO} \times C_S} \quad (12)$$

$$= \frac{1}{2}\sqrt{(x \times N \times I_{SOURCE}) \times K_{VCO} \times C} \times \frac{1}{f_{VCO} \times C_S}$$

$$\Rightarrow \zeta \propto \sqrt{x \times N}.$$

From Equation (10) and Equation (12), it is known that both the damping factor $\zeta$ and the bandwidth-to-reference frequency ratio $$\frac{\omega_n}{\omega_{REF}}$$

are desired to be proportional to $\sqrt{x \times N}$, and thus the damping factor $\zeta$ and the bandwidth-to-reference frequency ratio $$\frac{\omega_n}{\omega_{REF}}$$

are of constant values at $$N = \frac{1}{x}.$$

However, such a configuration may encounter the problem of having charge burst caused by switching. To overcome this, the filter 330 shown in FIG. 4 is used, which picks a phase error charge, eliminates it after one period and re-picks another phase error charge. The detail operation of the filter 330 is described as follows.

As shown in FIG. 4, the voltage variation ΔV caused by the charge pump 320 at the terminal FS1 is stored in the second capacitor C2. The voltage variation ΔV is defined as $$\frac{Q_I}{C_2}.$$

The current variation caused by the voltage variation ΔV at the terminal FF is defined as $$\Delta V \times 2g_m \left( = \frac{Q_I}{C_2} \times 2g_m \right).$$

The current variation lasts one period $$T_{REF}\left( = \frac{N}{f_{VCO}} = N \times T_{VCO} \right),$$

and accordingly the charge $Q_O$ produced at the terminal FF can be expressed as:

$$Q_O = \frac{Q_I}{C_2} \times 2g_m \times N \times T_{VCO}. \quad (13)$$

A variable y is defined as a ratio of an equivalent resistance, which is derived from the discrete time loop filter, to a small signal resistance, which is derived from the shunt of the first and the second NMOS transistors N1 and N2 by connecting gates and drains of the first and the second NMOS transistors N1 and N2 and connecting the sources to the ground. Accordingly, equation (14) is shown as follows:

$$y \triangleq \frac{Q_O}{Q_I} = \frac{2g_m}{C_2} \times N \times T_{VCO} = \frac{2g_m}{C_2} \times N \times \frac{1}{f_{VCO}}. \quad (14)$$

As shown in FIG. 4, the equivalent resistance $R_{loop}$ seen across the terminal FF and the ground is expressed as:

$$R_{loop} = y\left(\frac{1}{g_m} // \frac{1}{g_m}\right) = \frac{y}{2 \times g_m}. \quad (15)$$

Taking equation (15) into equation (11), the damping factor $\zeta$ can be found:

$$\zeta = \frac{1}{2}\sqrt{\frac{1}{N} \times I_{CH} \times K_{VCO} \times C_1} \times R_{Loop} \quad (16)$$

$$= \frac{1}{2}\sqrt{\frac{1}{N} \times x \times (2 \times I_D) \times K_{VCO} \times C_1} \times \frac{y}{2 \times g_m}$$

$$= \frac{1}{2}\sqrt{\frac{1}{N} \times x \times (2I_D) \times C_1} \times \left\{\frac{1}{2g_m} \times \frac{2g_m}{C_2} \times N \times \frac{1}{f_{VCO}}\right\} \times \sqrt{K_{VCO}}$$

$$\Rightarrow \zeta \propto \sqrt{x \times N} \times \frac{1}{f_{VCO}} \times \sqrt{I_D}.$$

Figure 10:
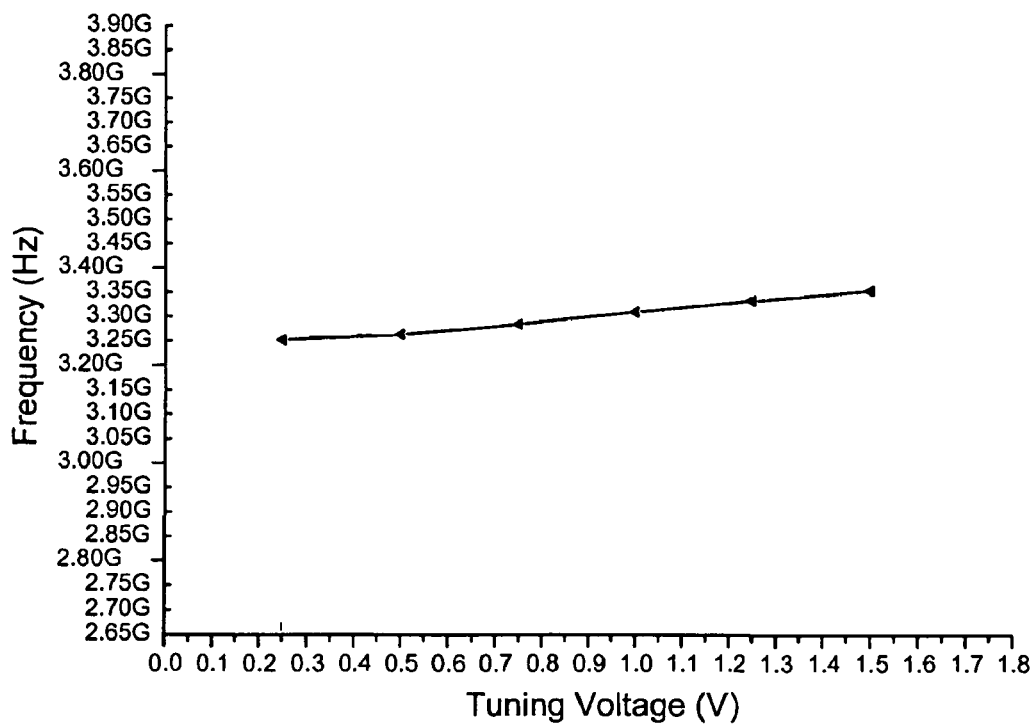
FIG. 10 is a schematic graph of tuning voltage versus frequency for a typical narrowband system.

FIG. 10 is a schematic graph of tuning voltage versus frequency for the typical narrowband system, in which the tunable frequency range is quite narrow. Accordingly, $$\frac{1}{f_{VCO}}$$

in equation (16) can be regarded as a constant for the narrowband system, and the damping factor ζ and the bandwidth-to-reference frequency ratio $$\frac{\omega_n}{\omega_{REF}}$$

are also constants for $$N = \frac{1}{x},$$

when $K_{VCO}$ and $\sqrt{I_D}$ are constants, respectively.

Figure 11:
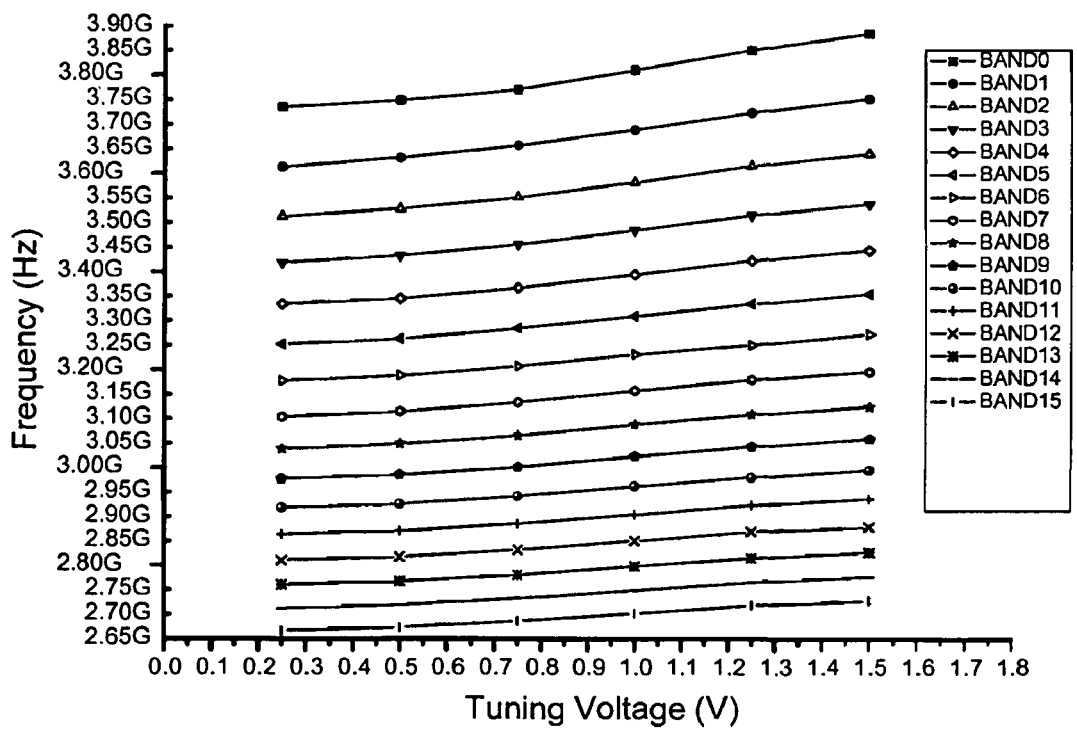
FIG. 11 is a schematic graph of tuning voltage versus frequency for a wideband system according to an embodiment of the invention.

In the invention, since the delay cells 530 can provide a wider frequency selection than the prior art, the wideband frequency tuning can be obtained. For example, as shown in FIG. 7, the control lines B[0]-B[5] can provide 32 bands in selection and tuning. FIG. 11 is a schematic graph of tuning voltage versus frequency for a wideband system according to an embodiment of the invention. As shown in FIG. 11, due to the control lines B[0]-B[5], more bands in the invention can be selected in comparison with the prior art. Thus, the wideband frequency tuning is achieved.

The control configuration of the oscillator 510 in FIG. 5 is of a ring oscillator. The jitter in such a ring oscillator is related to the selection and implementation of the ring oscillator in design configuration. In an optimal ring oscillator, the jitter is generated by thermal noise and shot noise of the active and passive elements of the delay cells. Accordingly, reducing the affection of the thermal and shot noises of the delay cells is a key of reducing the jitter. Typically, the jitter and phase noises in a PLL are difficult to predict by a typical simulator.

Figure 12:
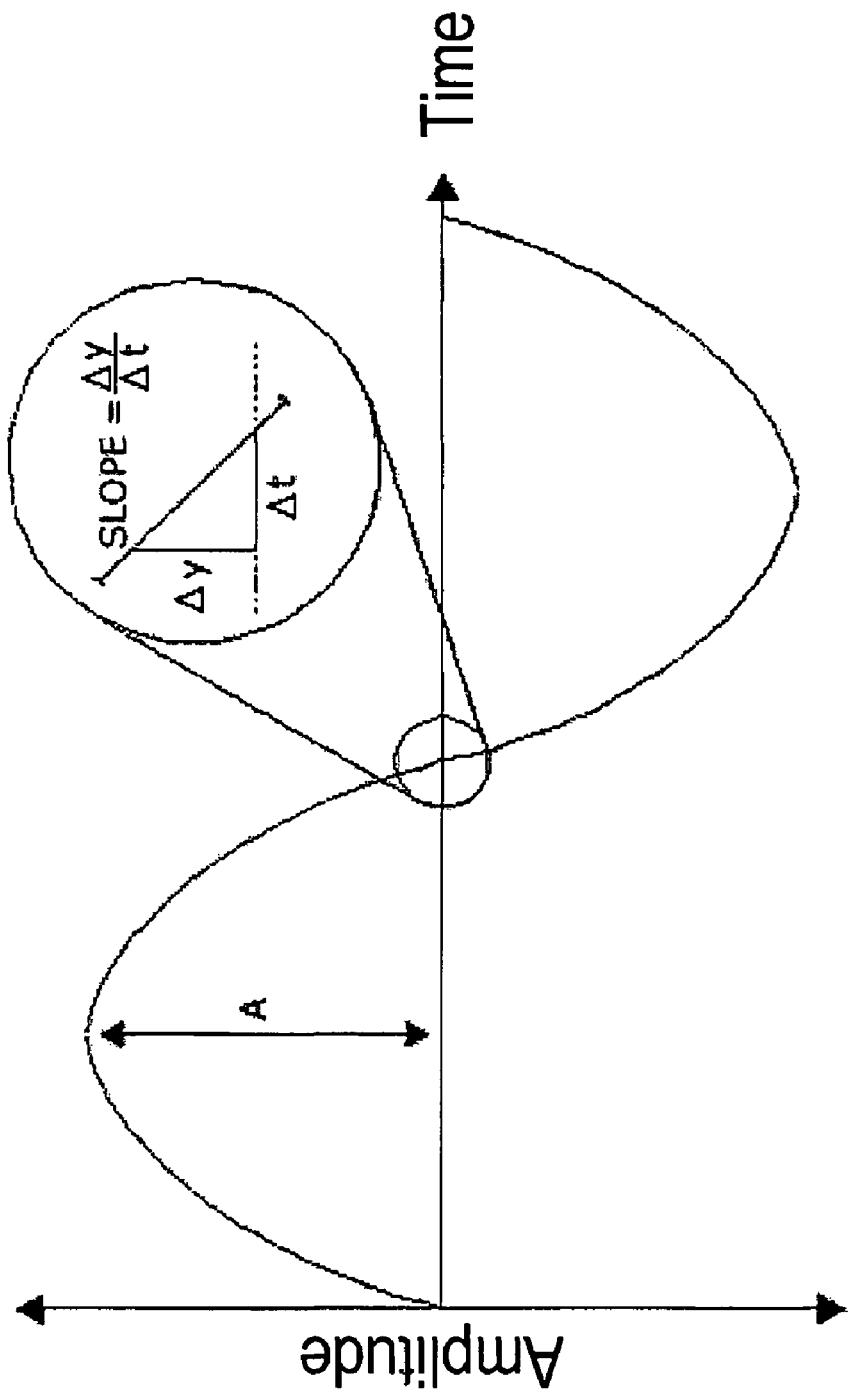
FIG. 12 is a schematic graph of a signal affected by a jitter according to an embodiment of the invention.

FIG. 12 is a schematic graph of a signal affected by a jitter according to an embodiment of the invention. As shown in FIG. 12, the noise voltage Δy at the zero-crossing causes the signal to arrive at the zero-crossing by Δt in advance. Upon a first crossing approximation, the jitter can be expressed as:

$$Jitter_{RMS} = \frac{v_{nRMS}}{A\omega}, \tag{17}$$

where $Jitter_{RMS}$ indicates a root mean square (rms) of a jitter, $v_{nRMS}$ indicates a root mean square of a noise signal, 'A' indicates an amplitude of a signal, and ω indicates a frequency of the signal.

The thermal noises contribute a timing variation to the differential output terminals. A typical noise analysis skill and a noise spectrum density integration are used to determine an output voltage noise. The integration is performed by integrating a bandwidth of an LPF, and the bandwidth depends on the load resistance and capacitance of a following stage. Accordingly, the root mean square (rms) of a jitter on a single stage can be expressed as:

$$J_{1\ rms} = \frac{\sqrt{\frac{2kT}{C_{eff}}} \times \left(\sqrt{1 + \frac{2}{3}a_V}\right)}{A\omega}, \tag{18}$$

where $a_v$ indicates a gain of a small signal, $C_{eff}$ indicates an equivalent capacitance, k indicates Boltzmann constant, i.e., $k=1.38\times10^{-23}$, and T indicates a Kevin temperature. The voltage variation on equation (18) can be regarded as a sum of thermal noises at each node of the delay cell 530 shown in FIG. 6. When the time-variant feature of the noises is considered, the root mean square (rms) of the jitter on the single stage can be rewritten as:

$$J_{1\ rms} = \tag{19}$$

$$\frac{\sqrt{\frac{2kT}{C_{eff}}} \times \frac{1}{(V_{GS}-V_t)}}{A\omega} \times \sqrt{1 + \frac{2}{3}a_V(1-e^{-t/\tau}) + \frac{2\sqrt{2}}{3}a_V e^{-t/\tau}},$$

where $V_{GS}$ indicates a gate-source voltage of a transistor, $V_t$ indicates an equivalent capacitance, and τ indicates a time constant.

Upon the first crossing approximation, each cycle jitter or a cycle-to-cycle jitter can be expressed as:

$$J_{n\ rms} = \frac{\sqrt{\frac{2kT}{C_{eff}}} \times \left(\frac{T_{VCO}}{2n \times C_{eff}}\right) \times (\beta) \times \sqrt{1 + \frac{2}{3}a_V(1-e^{-t/\tau}) + \frac{2\sqrt{2}}{3}a_V e^{-t/\tau}}}{A \times \frac{2\pi}{T_{VCO}}}, \tag{20}$$

$$J_{n\ rms} \propto C_{eff}^{3/2}.$$

The frequency $f_{VCO}$ of the differential output signal CK(+), CK(−) of the controllable oscillator 350 can be expressed as:

$$f_{VCO} = \frac{1}{2n \times R_{Load} \times C_{eff}} \Rightarrow R_{Load} = \frac{T_{VCO}}{2n \times C_{eff}}, \text{so} \tag{21}$$

$$R_{Load} = \frac{1}{g_{m\_VCOCell}} = \frac{1}{\beta(V_{GS}-V_T)}. \tag{22}$$

From equation (21) and equation (22), equation (23) is derived as follows:

$$\frac{1}{(V_{GS}-V_T)} = \left(\frac{T_{VCO}}{2n \times C_{eff}}\right) \times (\beta), \tag{23}$$

$$\text{where } \beta = \mu_n C_{OX} \frac{W}{L}.$$

On designing a low jitter circuit, the parameter ($V_{GS}-V_T$) for the self-bias controllable oscillator 350 is preferably selected to be as high as possible, while the parameter $a_v$ is in the range of 1.3-3.

From equation (20), it is known that the increase on the parameter $C_{eff}$ can improve the jitter when the other parameters on design are fixed. However, the increase on the parameter $C_{eff}$ is linear to the power consumption. Namely, the improvement on the power consumption and the improvement on the jitter are exclusive to each other.

Figure 14:
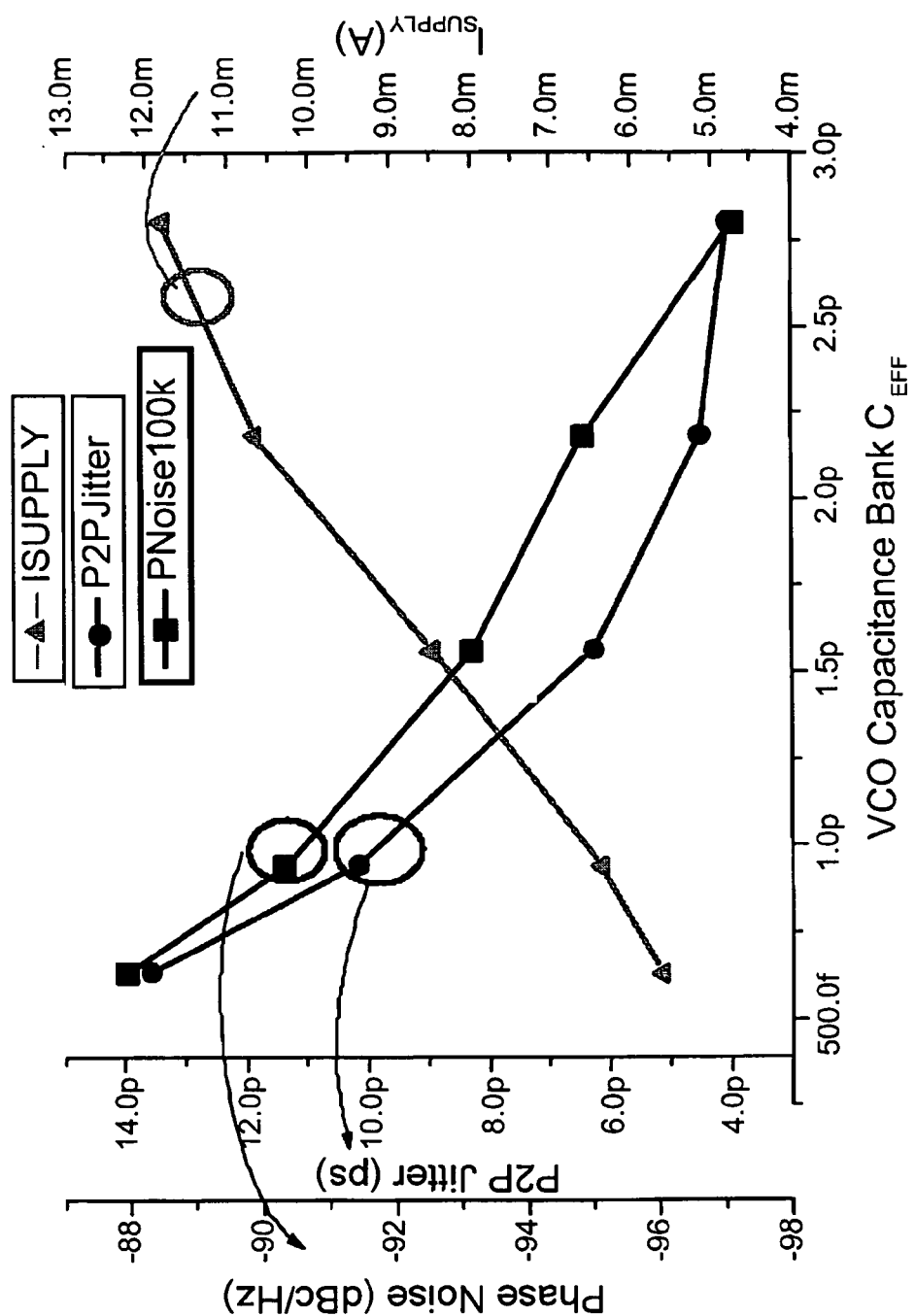
FIG. 14 is a schematic graph of a simulation of a VCO according to an embodiment of the invention.

The invention uses a Spectre-RF simulator supplied by Cadence to simulate the phase noise and jitters of the VCO. FIG. 13 is a table of parameters according to an embodiment of the invention. As shown in FIG. 13, the parameters include the rms jitter, the power consumption $I_{VCO}$, and the VCO load capacitance CAP. FIG. 14 is a schematic graph of simulation of a voltage controlled oscillator (VCO) according to an embodiment of the invention. As shown in FIG. 14, the VCO jitter is inversely proportional to the effective VCO load capacitance $C_{\mathit{eff}}$ and directly proportional to the power consumption $I_{SUPPLY}$. This result consists with equation (20) derived from the principles.

Figure 15:
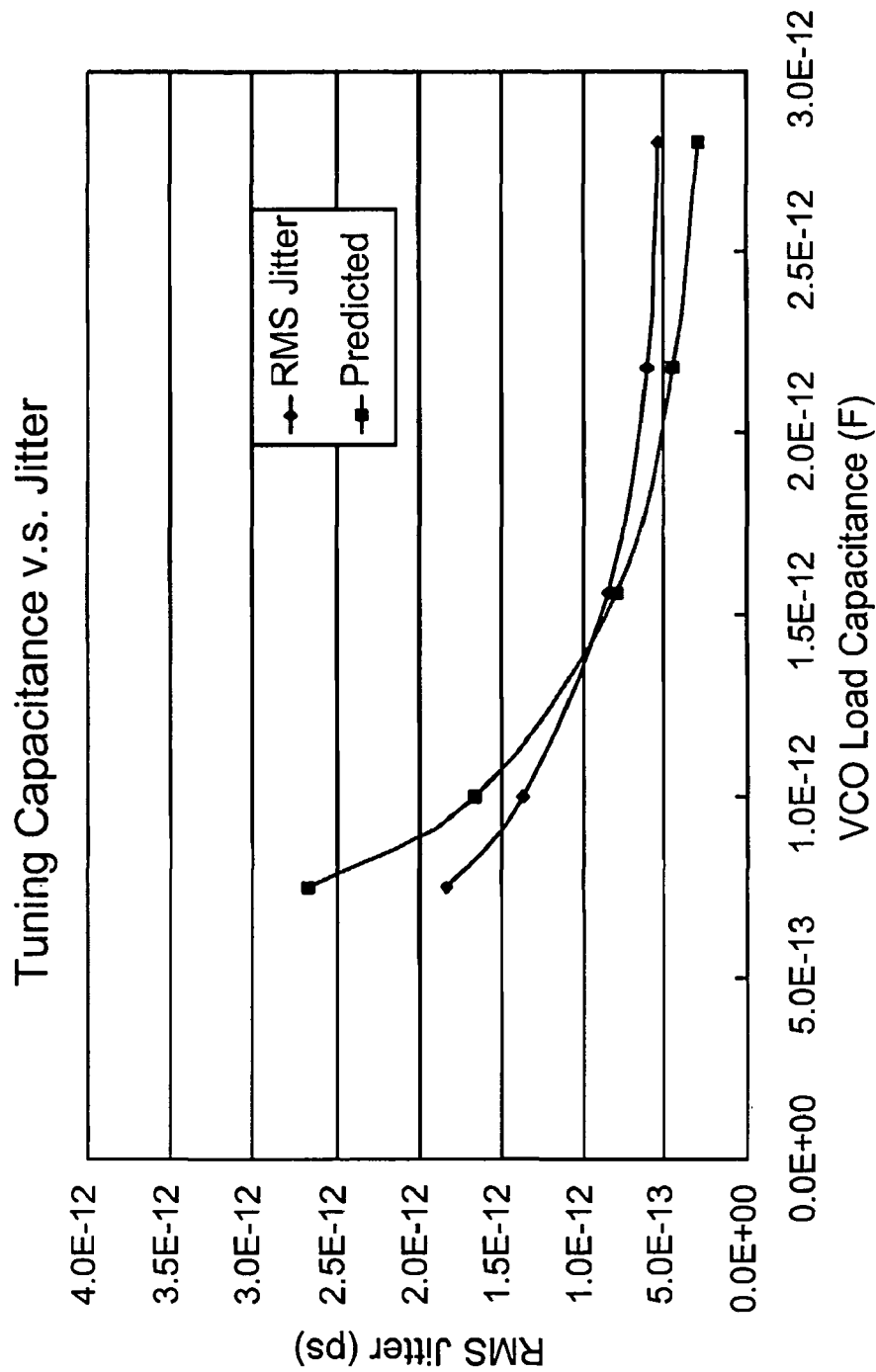
FIG. 15 is a schematic graph of root mean square jitter versus VCO load capacitance according to an embodiment of the invention.

FIG. 15 is a schematic graph of root mean square (rms) jitter versus VCO load capacitance (CAP) according to an embodiment of the invention. As shown in FIG. 15, the timing jitter is reduced with the increased $$C_{\mathit{eff}}^{\frac{3}{2}}.$$

Namely, the jitter is reduced by means of increasing the capacitance.

The oscillator 510 in the invention is comprised of delay cells 530 in a differential ring oscillator configuration in which the positive output terminal of a preceding stage is connected to the negative input terminal of a following stage and the negative output terminal of the preceding stage is connected to the positive input terminal of the following stage. The oscillator 510 has a sensitivity $K_{VCO}$ which can be derived and expressed by the parameters $g_m$ and $C_B$ as follows.

If the oscillator 510 is a three-stage VCO, the frequency $f_{VCO}$ can be expressed as:

$$f_{VCO} = \frac{1}{2n \times R_{VCO} \times C_{\mathit{eff}}}, \text{ so}$$

$$f_{VCO} = \frac{1}{2n \times R_{VCO} \times C_{\mathit{eff}}} = \frac{1}{2n \times \frac{1}{g_{m\_VCOCell}} \times C_{\mathit{eff}}} =$$

$$\frac{g_{m\_VCOCell}}{2n \times C_{\mathit{eff}}} = \frac{g_{m\_VCOCell}}{C_B} = \frac{\beta(V_{GS} - V_T)}{C_B} = \frac{\sqrt{2\beta \times I_D}}{C_B},$$

and the sensitivity $K_{VCO}$ can be expressed as:

$$K_{VCO} = \frac{df}{dV} = \frac{\beta}{C_B}. \tag{24}$$

Figure 16:
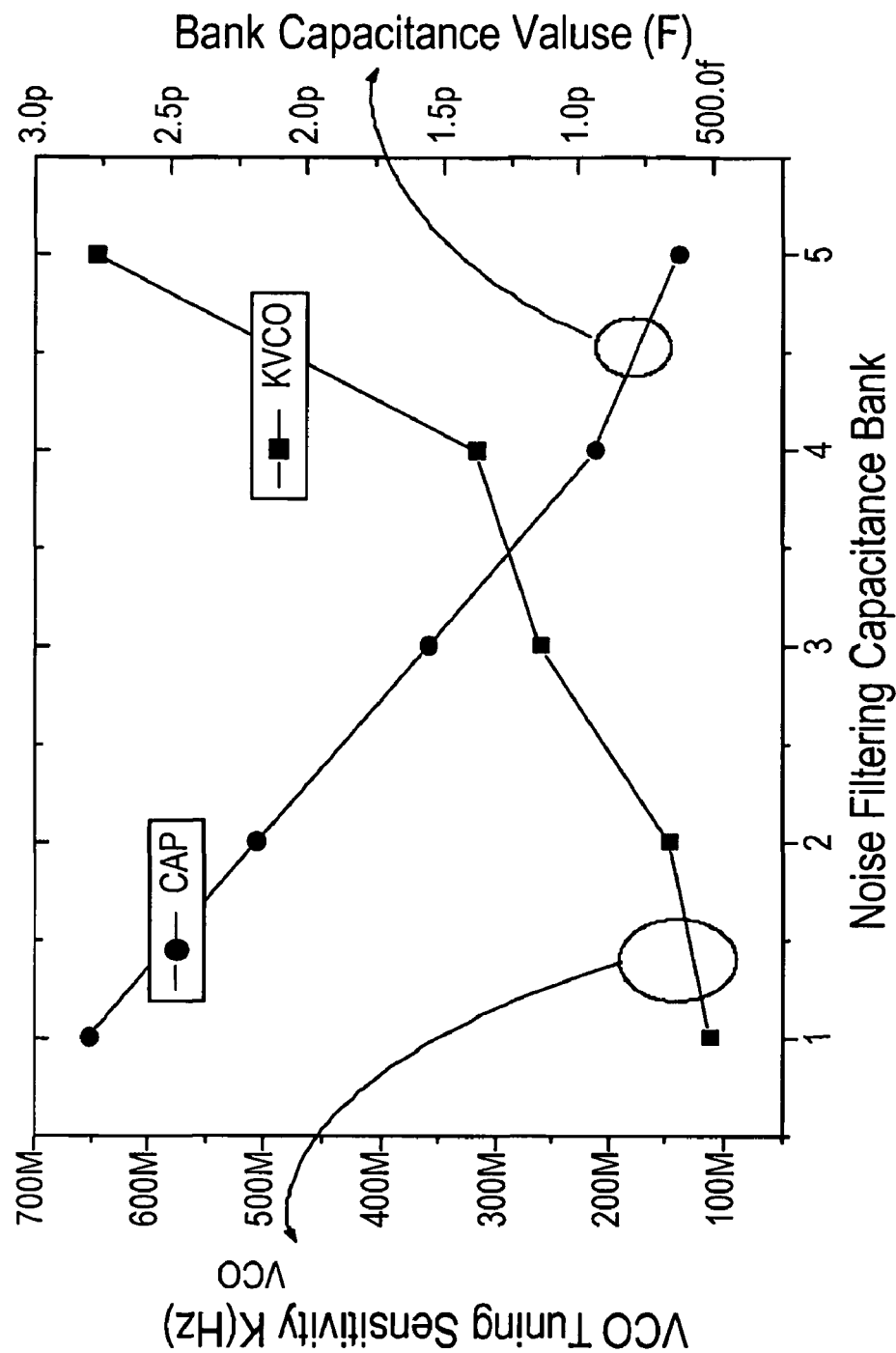
FIG. 16 is a schematic graph of corresponding VCO tuning sensitivity, bank capacitance value versus noise filtering capacitance bank according to an embodiment of the invention.

From equation (24), it is obvious that increasing the capacitance load $C_B$ can lower the VCO sensitivity $K_{VCO}$. Therefore, the programmable capacitance bank controller 520, the first capacitance bank 610 and the second capacitance bank 620 can tune or adjust the total VCO capacitance load to a value of $6C_{\mathit{eff}}$. FIG. 16 is a schematic graph of corresponding VCO tuning sensitivity $K_{VCO}$, bank capacitance value versus noise filtering capacitance bank according to an embodiment of the invention, which indicates the influence of the sensitivity $K_{VCO}$ when the capacitance load $C_B$ is increased.

Figure 17:
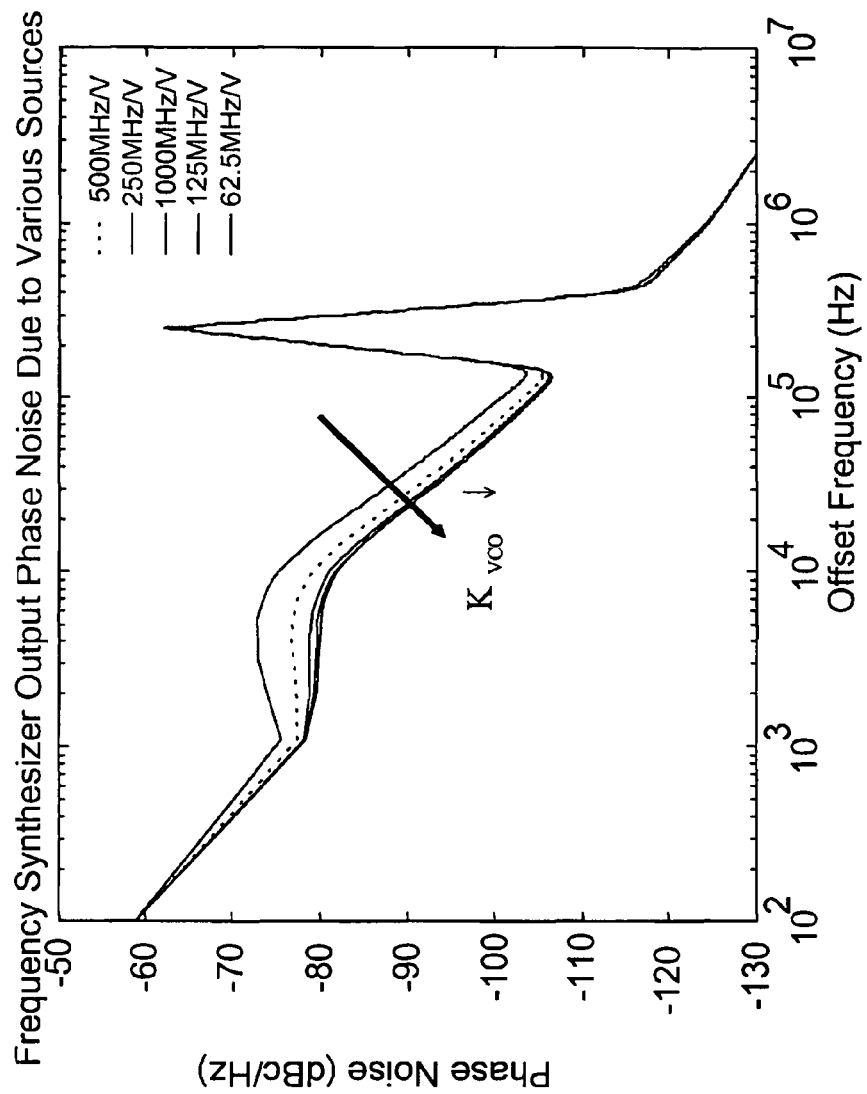
FIG. 17 is a schematic graph of phase noise and VCO tuning sensitivity according to an embodiment of the invention.

Therefore, the disturbance of the control line, which causes the PLL to generate noises, can cause the PLL a smaller jitter by reducing the VCO sensitivity $K_{VCO}$. FIG. 17 is a schematic graph of phase noise and VCO tuning sensitivity according to an embodiment of the invention. As shown in FIG. 17, the higher sensitivity $K_{VCO}$ causes greater phase noises at the band edges.

As cited, the invention uses the relation of the mirror current $I_{CH}$ and the source current $I_{SOURCE}$, i.e., $I_{CH}$=x×$I_{SOURCE}$, sets $$x = \frac{1}{N},$$

and uses the discrete time loop filter to thereby make the damping factor $\zeta$ and the bandwidth-to-reference frequency ratio $$\frac{\omega_n}{\omega_{REF}}$$

to be independent of N. In addition, the invention uses the relationship between the compensation current $I_{COMP}$ and the mirror current $I_{CH}$ to compensate the variation of the damping factor $\zeta$ and the bandwidth-to-reference frequency ratio $$\frac{\omega_n}{\omega_{REF}}$$

when the controllable oscillator outputs the wideband output signal. Further, the invention uses the first capacitor C1, the first switch SW1, the operational amplifier OP, the first NMOS transistor N1, the second NMOS transistor N2, the first PMOS transistor P1 and the second PMOS transistor P2 to produce the resistance (the equivalent resistor) required for the filter 330 to thereby act as a discrete time loop filter, which is not shown in the prior art and can be easily implemented in an integrated circuit (IC). Furthermore, the invention uses the capacitance bank controller 520 to control the values of the capacitance banks 610 and 620 to thereby provide more load capacitance and eliminate more phase errors of the controllable oscillator 350. The invention, as compared to the prior art, uses the capacitance bank controller 520 to dynamically set the values of the capacitance banks 610 and 620, so as to allow a higher control voltage to control the controllable oscillator 350 and reduce the power consumption and jitter of the PLL. Therefore, the PLL can be implemented in an integrated circuit easier than the prior art.

Although the present invention has been explained in relation to its preferred embodiment, it is to be understood that many other possible modifications and variations can be made without departing from the spirit and scope of the invention as hereinafter claimed.

What is claimed is:

1. A frequency synthesis system with self-calibrated loop stability and bandwidth, comprising:
   a detector, for receiving an input signal and a feedback signal to produce a detection signal based on a logic level difference between the input signal and the feedback signal;
   a charge pump, connected to the detector, for producing a control signal based on the detection signal and a compensation current;

a filter, connected to the charge pump, for producing a tuning signal and a source current based on the control signal;

a bias circuit, connected to the filter, for producing a first bias signal and a second bias signal based on the tuning signal;

a controllable oscillator, connected to the bias circuit, for producing a differential output signal with a selected specific frequency based on the first bias signal and the second bias signal;

a differential-to-single converter, connected to the controllable oscillator, for converting the differential output signal into an output signal;

a programmable frequency divider, connected to the differential-to-single converter, for producing the feedback signal based on the output signal;

a current mirror circuit, for receiving the source current to produce a mirror current;

a compensation circuit, for producing the compensation current based on the mirror current so as to compensate a variation of a damping factor and a bandwidth-to-reference frequency ratio.

2. The frequency synthesis system as claimed in claim 1, wherein the controllable oscillator comprises an oscillation circuit to produce the differential output signal with the selected specific frequency.

3. The frequency synthesis system as claimed in claim 1, wherein the filter is a low pass discrete time loop filter.

4. The frequency synthesis system as claimed in claim 3, wherein the low pass discrete time loop filter comprises a first capacitor, a second capacitor, a first switch, an operational amplifier, a first NMOS transistor, a second NMOS transistor, a first PMOS transistor and a second PMOS transistor, wherein the operational amplifier has an output terminal connected to a gate of the first PMOS transistor, the first PMOS transistor has a source connected to a high voltage and a drain connected to a source of the second PMOS transistor, the second PMOS transistor has a gate connected to a low voltage and a drain connected to a non-inverting input terminal of the operational amplifier and to gates and drains of the first and the second NMOS transistors, and the first and the second NMOS transistors have sources connected to the low voltage.

5. The frequency synthesis system as claimed in claim 4, wherein the bias circuit comprises a third PMOS transistor, a fourth PMOS transistor and a first symmetric load comprised of a third NMOS transistor and a fourth NMOS transistor, wherein the operational amplifier has the output terminal connected to a gate of the third PMOS transistor to produce the first bias signal, the third PMOS transistor has a source connected to the high voltage and a drain connected to a source of the fourth PMOS transistor, the fourth PMOS transistor has a gate connected to the low voltage and a drain connected to gates and drains of the third and the fourth NMOS transistors to produce the second bias signal, and the third and the fourth NMOS transistors have sources connected to the low voltage.

6. The frequency synthesis system as claimed in claim 2, wherein the oscillation circuit comprises:

an oscillator, having a plurality of delay cells; and a capacitance bank controller, for controlling the delay cells to produce the differential output signal with the selected specific frequency.

7. The frequency synthesis system as claimed in claim 6, wherein each delay cell comprises a fifth PMOS transistor, a sixth PMOS transistor, a seventh PMOS transistor, a third symmetric load comprised of a fifth NMOS transistor and a sixth NMOS transistor, a fourth symmetric load comprised of a seventh NMOS transistor and an eighth NMOS transistor, a first capacitance bank and a second capacitance bank, wherein the fifth PMOS transistor has a source connected to the high voltage, a gate connected to the first bias signal and a drain connected to sources of the sixth and the seventh PMOS transistors, the sixth PMOS transistor has a drain connected to a drain and a gate of the fifth NMOS transistor and a drain of the sixth NMOS transistor, the seventh PMOS transistor has a drain connected to a drain and a gate of the eighth NMOS transistor and a drain of the seventh NMOS transistor, the sixth and the seventh NMOS transistors have gates connected to the second bias signal, the fifth to eighth NMOS transistors have sources connected the low voltage, the first capacitance bank is connected to the gate of the fifth NMOS transistor, and the second capacitance bank is connected to the gate of the eighth NMOS transistor.

8. The frequency synthesis system as claimed in claim 7, wherein both the first capacitance bank and the second capacitance bank comprises a plurality of capacitance selectors, including a plurality of capacitors and a plurality of switches.

9. The frequency synthesis system as claimed in claim 8, wherein each of the switches is an NMOS transistor.

10. The frequency synthesis system as claimed in claim 8, wherein the capacitors are metal-insulator-metal (MIM) capacitors.

11. The frequency synthesis system as claimed in claim 1, wherein the differential-to-single converter is a frequency divider with a divisor of two to thereby improve positive and negative edge symmetry of the output signal.

12. The frequency synthesis system as claimed in claim 11, wherein the capacitors of each of the first and the second capacitance banks are expressed as:

$$(C_{Paracitic}+B[1] \times C_{B1}+B[2] \times C_{B2}+B[3] \times C_{B3}+B[4] \times C_{B4}+B[5] \times C_{B5}),$$

where $C_{Paracitic}$ indicates parasitic and stray capacitance, and B[1],B[2],B[3],B[4],B[5] indicate control signals outputted from the capacitance bank controller to each of the first and the second capacitance banks.

13. The frequency synthesis system as claimed in claim 12, wherein a frequency $f_{VCO}$ of the differential output signal outputted by the controllable oscillator is expressed as:

$$f_{VCO} = \frac{g_m}{C_B} = \frac{g_m}{2n \times C_{\textit{Eff}}} = \frac{g_m}{2n \times \left( \begin{array}{c} C_{Paracitic} + B[1] \times C_{B1} + B[2] \times C_{B2} + \\ B[3] \times C_{B3} + B[4] \times C_{B4} + B[5] \times C_{B5} \end{array} \right)},$$

where $C_B$ indicates a capacitance of the oscillator, n indicates the number of delay cells, $C_{\textit{Eff}}$ indicates a capacitance of the delay cells, and $g_m$ indicates a transconductance of the delay cells.

14. The frequency synthesis system as claimed in claim 1, wherein the mirror current equals to x times of the source current in order to allow the damping factor and the bandwidth-to-reference frequency ratio to be positively proportional to $\sqrt{x \times N}$, where x is a positive integer and N indicates a divisor of the programmable frequency divider.

15. The frequency synthesis system as claimed in claim 14, wherein the compensation current equals to $1/\Psi$ times of the mirror current in order to compensate the variation of the damping factor and the bandwidth-to-reference frequency ratio when the controllable oscillator outputs the output signal with the selected specific frequency, where $\Psi$ indicates a positive integer.

* * * * *